(12) United States Patent
Nishigaki et al.

(10) Patent No.: US 12,354,854 B2
(45) Date of Patent: Jul. 8, 2025

(54) FILM FORMATION APPARATUS

(71) Applicant: SHIBAURA MECHATRONICS CORPORATION, Yokohama (JP)

(72) Inventors: Hisashi Nishigaki, Yokohama (JP); Koji Yoshimura, Yokohama (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 586 days.

(21) Appl. No.: 17/657,262

(22) Filed: Mar. 30, 2022

(65) Prior Publication Data

US 2022/0319820 A1 Oct. 6, 2022

(30) Foreign Application Priority Data

Mar. 31, 2021 (JP) ................. 2021-059070

(51) Int. Cl.
*H01J 37/32* (2006.01)
*C23C 14/34* (2006.01)
*C23C 14/50* (2006.01)
*C23C 14/54* (2006.01)
*C23C 14/56* (2006.01)

(52) U.S. Cl.
CPC ........ *H01J 37/32733* (2013.01); *C23C 14/34* (2013.01); *C23C 14/505* (2013.01); *C23C 14/541* (2013.01); *C23C 14/568* (2013.01); *H01J 37/3244* (2013.01); *H01J 37/32724* (2013.01)

(58) Field of Classification Search
None
See application file for complete search history.

(56) References Cited

U.S. PATENT DOCUMENTS

| | | | | |
|---|---|---|---|---|
| 5,667,592 A * | 9/1997 | Boitnott | ............ | H01L 21/67196 204/298.25 |
| 5,743,965 A * | 4/1998 | Nishimura | ............ | B05C 11/08 414/217 |
| 2004/0234359 A1* | 11/2004 | Mitchell | ............ | H01L 21/67213 414/217 |

(Continued)

FOREIGN PATENT DOCUMENTS

| CN | 104428441 A | 3/2015 |
|---|---|---|
| CN | 110904425 A | 3/2020 |

(Continued)

*Primary Examiner* — Jason Berman
(74) *Attorney, Agent, or Firm* — Oblon, McClelland, Maier & Neustadt, L.L.P.

(57) ABSTRACT

According to one embodiment, a film formation apparatus that suppresses effects of pre-processing and enables stable film formation is provided. A film formation apparatus of the present disclosure includes a chamber that can be made vacuum, a transporter that is provided inside the chamber and that circulates and transports a workpiece in a trajectory of a circle, a film formation unit that forms film by sputtering on the workpiece circulated and transported by the transporter, a load-lock room that loads the workpiece into and out of the chamber relative to air space while keeping an interior of the chamber vacuum, and a pre-processing unit that is provided in the chamber at a position adjacent to the load-lock room and that performs pre-processing to the workpiece loaded in from the load-lock room in a state distant from the transporter.

7 Claims, 21 Drawing Sheets

(56) References Cited

U.S. PATENT DOCUMENTS

| | | | |
|---|---|---|---|
| 2007/0207014 A1* | 9/2007 | Toshima | H01L 21/68778 414/217 |
| 2010/0111648 A1* | 5/2010 | Tamura | H01L 21/67248 414/217 |
| 2015/0348773 A1 | 12/2015 | Zhu et al. | |
| 2017/0369987 A1 | 12/2017 | Ito | |
| 2020/0087774 A1 | 3/2020 | Keigler et al. | |

FOREIGN PATENT DOCUMENTS

| | | |
|---|---|---|
| JP | 5-331618 | 12/1993 |
| JP | 2001-73114 A | 3/2001 |
| JP | 2003-13223 A | 1/2003 |
| JP | 2018-3152 A | 1/2018 |
| KR | 10-2020-0075763 A | 6/2020 |
| KR | 10-2198612 B1 | 1/2021 |

* cited by examiner

FILM FORMATION APPARATUS

CROSS-REFERENCE TO RELATED APPLICATION

This application is based upon and claims the benefit of priority from Japan Patent Application No. 2021-059070, filed on Mar. 31, 2021, the entire contents of which are incorporated herein by reference.

FIELD OF INVENTION

The present disclosure relates to a film formation apparatus.

BACKGROUND

In manufacturing processes of wireless communication devices such as mobile phones, semiconductor devices that are electronic components are sealed by resin, and electromagnetic wave shielding film which has shielding effect against electromagnetic waves may be formed on an upper surface and a side surface thereof. Furthermore, in manufacturing processes of various products such as semiconductors, displays, and optical discs, for example, film such as optical film may be formed on wafers, glass, and resin substrates.

To form film on a surface of workpieces such as electronic components, wafers, glass, and resin substrates, sputtering is getting attention. A plasma processing apparatus to form film by using plasma is suggested as an apparatus to form film by sputtering. In the plasma processing apparatus, inert gas is introduced in a vacuum container inside which a target is arranged, and current is applied. Ions of plasma inert gas is bombarded to the target made of film formation material, and the materials beaten out from the target is deposited on a workpiece, to form film.

As an apparatus to form film by sputtering, an apparatus forming film by circulating and transporting workpieces in a trajectory of a circle through a film formation room by using a rotation table inside a vacuum chamber is suggested.

SUMMARY OF INVENTION

Problems to be Solved by Invention

To improve the adhesion of the workpiece and the film formed thereon, bombardment by plasma is performed on a surface of the workpiece before forming the film. In the above-described circulation-transport-type apparatus, to efficiently perform the film formation by sputtering and the bombardment, a film formation room and a plasma processing room are provided inside the vacuum chamber. The bombardment is performed by circulating and transporting the workpiece in the trajectory of circle through the film formation room by using the rotation table inside the vacuum chamber, and then plasma production in the plasma processing room is stopped. Next, plasma is produced in the film formation room, and the workpiece is circulated and transported through the film formation room to form film.

In the circulation-transport-type plasma processing, plasma was produced from argon gas. However, since the plasma processing room and the film formation room is merely divided by a wall which has a gap for the workpiece that is placed on the rotation table and is circulated and transported, there was a concern that argon gas introduce in the plasma processing room might contaminate in the film formation room, causing pressure change in the film formation room.

For example, there had to be gap of about 5 mm between an opening of the plasma processing room and the rotation table for the workpiece to pass through. This value takes the change in the height level due to the transformation of a lid of the chamber provided in the plasma processing room into consideration, and is set so that the workpiece can pass through the gap even when the flatness of the rotation table changes. Therefore, it is not a gap that is most preferable to completely prevent gas leakages from the gap.

When forming film by sputtering, the chamber of the film formation apparatus is depressurized. This is to reduce impurities inside the chamber and to reduce gas molecules to enlarge the mean free path of the gas molecules. As a result, the film formation material beaten out from the target reaches the workpiece, and stable and dense film is formed. Therefore, when gas inside the plasma processing room may leak to the other rooms such as the film formation room and the vacuum level of the plasma processing room decreases, stable film may not be attached. Furthermore, when using argon gas in the film formation room and mixture gas of argon and oxygen in the plasma processing room, contamination in which one of the gas entering the other may occur, inhibiting both reaction.

Furthermore, as a pre-processing before the film formation, degassing process by heating the workpiece may be performed to remove moisture and air included in the workpiece beforehand. However, in the above-described circulation-transport-type film formation apparatus utilizing rotation, when a heating room is provided to perform the degassing process, stable film may not be obtained if the removed gas component diffuses inside the chamber, contaminates into the film formation room, and attaches to the workpiece as impurities during film formation.

The present disclosure is suggested to address the above-described problem in the prior art, and the objective is to provide a film formation apparatus that suppresses effects of pre-processing and enables stable film formation.

Means to Solve the Problem

To achieve the above objective, a film formation apparatus of an embodiment includes:
  a chamber that can be made vacuum;
  a transporter that is provided inside the chamber and that circulates and transports a workpiece in a trajectory of a circle;
  a film formation unit that forms film by sputtering on the workpiece circulated and transported by the transporter;
  a load-lock room that loads the workpiece into and out of the chamber relative to air space while keeping an interior of the chamber vacuum; and
  a pre-processing unit that is provided in the chamber at a position adjacent to the load-lock room and that performs pre-processing to the workpiece loaded in from the load-lock room in a state distant from the transporter.

Effect of Invention

According to the present disclosure, a film formation apparatus that suppresses effects of pre-processing and enables stable film formation is provided.

EMBODIMENTS

An embodiment (hereinafter, referred to as the present embodiment) of the present disclosure will be described in detail with the reference to figures.

[Abstract]

Figure 1:
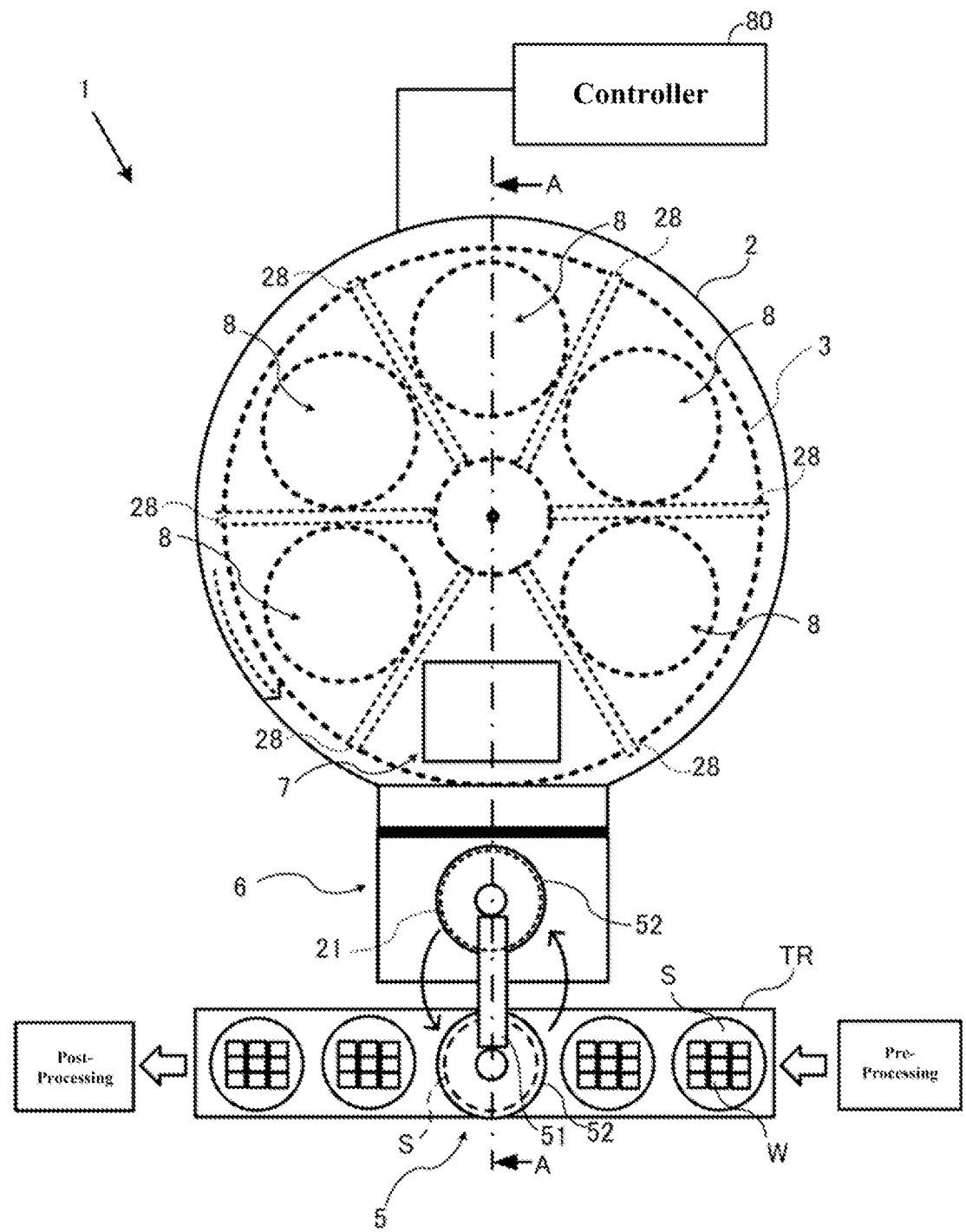
FIG. 1 is a simplified plan view illustrating an embodiment.
Figure 2A:
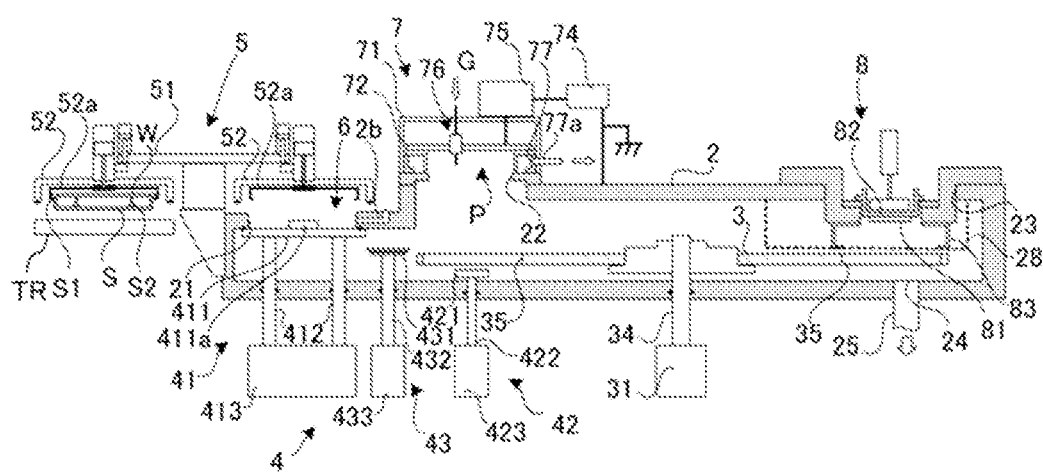
FIG. 2(A) is a cross-sectional diagram of FIG. 1 along A-A line.

As illustrated in the plan view of FIG. 1 and FIG. 2(A) (a cross-sectional diagram of FIG. 1 along A-A line), a film formation apparatus 1 of the present embodiment is an apparatus to form film on workpieces W by using plasma. The film formation apparatus 1 includes a chamber 2 that can be made vacuum by exhausting. A transporter 3 is arranged inside the chamber 2. The transporter 3 circulates and transports workpieces W in a trajectory of circle. The workpiece W that is transported is placed on a transport plate S.

The film formation apparatus 1 includes a driving unit 4, a loading unit 5, a load-lock room 6, a pre-processing unit 7, and a film formation unit 8. The driving unit 4 opens and closes the load-lock room 6, transfers the transport plate S between the load-lock room 6 and the transporter 3, and positions the transport plate S to the pre-processing unit 7. The loading unit 5 loads the transport plate S into and out of the chamber 2. The load-lock room 6 enables to load the workpiece W placed on the transport plate S in and out while keeping the chamber vacuum. The pre-processing unit 7 performs plasma-processing on the workpiece W. The film formation unit 8 performs film formation by sputtering on the workpiece W circulated and transported by the transporter 3.

[Workpiece]

As illustrated in FIG. 1, in the present embodiment, as the example workpiece W that is a film formation target, protective tape in which an electrode surface of an electronic component such as semiconductors may be pasted on a frame. However, types, shapes, and material of the workpiece W is not limited and specified.

[Transport Plate]

The transport plate S is a component on which the workpiece W is placed and which is transported by the trans porter 3. The transport plate S of the present embodiment is a thin cylinder with an upper opening and a bottom, and includes a flange S1 which extends outward in the radial direction from an upper. A pin S2 is provided in an inner bottom surface of the transport plate S to support the workpiece W with a gap therebetween. By holding the workpiece W via a gap between the workpiece W and the inner bottom surface, the heat accumulated in the transporter 3 due to the heat of plasma would hardly be transferred to the workpiece W via the inner bottom surface of the transport plate S when the transport plate S passes through the film formation unit 8. By this, the film can be formed while suppressing an increase in temperature of the workpiece W during the film formation, and variation in the quality of the film can be prevented. Note that the shape of the transport plate S is not limited to a cylinder as long as the workpiece W can be supported, and other shapes such as quadrilaterals, polygons, and shapes similar to the workpiece W may be employed.

[Chamber]

Figure 2B:
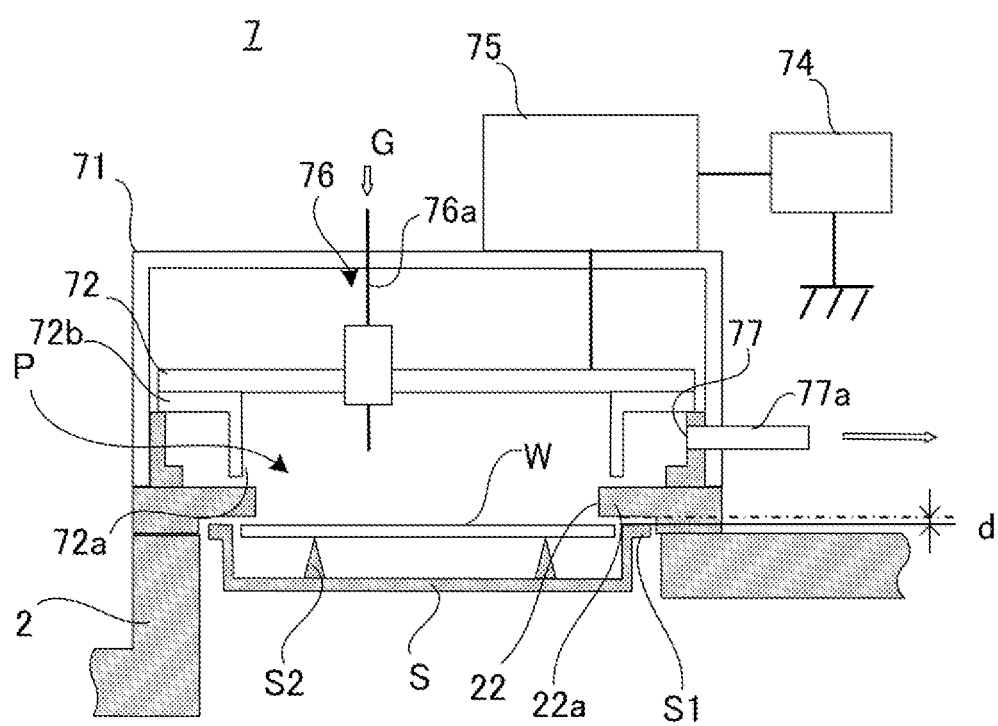
FIG. 2(B) is a cross-sectional diagram of a pre-processing unit along A-A line.

As illustrated in FIGS. 1 and 2, the chamber 2 is a columnar container. One side of the chamber 2 is expanded for the load-lock room 6, and an opening 21 for loading the transport plate S into and out of the chamber 2 is provided at a ceiling thereof. Openings 22 and 24 are provided at a ceiling of the chamber 2 opposite to an installation surface. The opening 22 is a hole provided between the chamber 2 and the pre-processing unit 7, and the opening 23 is a hole for providing the film formation unit 8.

Furthermore, a ventilation path 24 for exhausting in the chamber 2 is provided at a bottom of the film formation unit 8 in the chamber 2. The ventilation path 24 is connected to a piping 25 and can exhaust inside the chamber 2 by an unillustrated air pressure circuit such as depressurization pumps and valves.

As illustrated in FIGS. 1 and 2, the transporter 3 is a rotation table that is a circular plate. The transporter 3 rotates around a shaft 34 as a center by a motor 31 that is a driving source provided outside the chamber 2.

A support hole 35 is provided in the transporter 3. The support holes 35 are circular holes provided at plural locations in the circumferential direction of the transporter 3 with equal intervals therebetween. The transport plate S enters the support hole 35, and the flange S1 of the transport plate S is supported by the upper surface of the transporter 3. Note that the shape of the support hole 35 is not limited to a circle as long as the transport plate S can be supported, and other shapes such as quadrilaterals, polygons, and shapes similar to the transport plate S may be employed. Furthermore, the transporter 3 sequentially positions the support hole 35 at a position facing the opening 22 at the time of loading the transport S in and out.

[Driving Unit]

As illustrated in FIG. 2, the driving unit 4 includes a sealing unit 41, a biasing unit 42, and a transfer unit 43. The sealing unit 41 is provided correspondingly with the load-lock room 6 and is a mechanism to open and close the opening 21 while loading the transport plate S in and out. The biasing unit 42 a mechanism to position the workpiece W in the pre-processing unit 7 by exhausting from the transporter 3 during the film formation by the film formation unit 8 and biasing the workpiece W in the direction orthogonal to the transportation direction of the transporter 3 during the pre-processing by the pre-processing unit 7. The biasing unit 42 moves the transport plate S in the direction getting close to and away from the opening 22 separately from the transporter 3. The transfer unit 43 is a mechanism to transfer the transport plate from the load-lock room 6 to the transporter 3.

The sealing unit 41 includes a sealing 411, a shaft 312, and a driving mechanism 413. The sealing 411 is a circular tabular component, and a sealing component such as an O-ring is provided at an upper edge thereof. Furthermore, a placement base 411a on which the transport plate S is placed is provided at the center of an upper surface of the sealing 411. The shaft 412 supports the sealing 411 while reciprocating the sealing 411 in the axial direction. When the shaft 412 moves toward the opening 21, the sealing 411 presses the sealing component to the ceiling of the chamber 2 around the opening 21 to seal the chamber 2. The shaft 412 airtightly penetrates the bottom surface of the chamber 2 and is driven by the driving unit 413 outside the chamber 2 such as air cylinders.

The biasing unit 42 includes a pusher 421, a shaft 422, and a driving mechanism 423. The pusher 421 is a circular tabular component, and contacts with and separates from the transport plate S. The pusher 421 is provided at a position to receive the workpiece W from the load-lock room 6 and holds the workpiece W via the transport plate S. The shaft 422 supports the pusher 421 while reciprocating the pusher 421 in the axial direction, that is, the direction orthogonal to the surface of the transporter 3. The shaft 422 moves the pusher 421 between the surface of the transporter 3 and a hook 431b of a transfer arm 431, so that the transport plate S is delivered or received between the pusher 421 and the transfer arm 431. The shaft 422 moves toward the opening 2, so that the pusher 421 moves the transport plate S close to the pre-processing unit 7. By this, the workpiece W is placed at the position to perform processing by the pre-processing unit 7. The shaft 422 airtightly penetrates the bottom of the chamber 2 and is driven by the driving mechanism 423 outside the chamber 2, such as air cylinders. The shaft 422 is ascended and descended by the driving mechanism 423. Note that, in FIG. 2 and the following figures, the driving mechanisms 413 and 423 are simply illustrated, however, they are configured to ensure movement stroke of the shafts 412 and 422, respectively.

Figure 3:
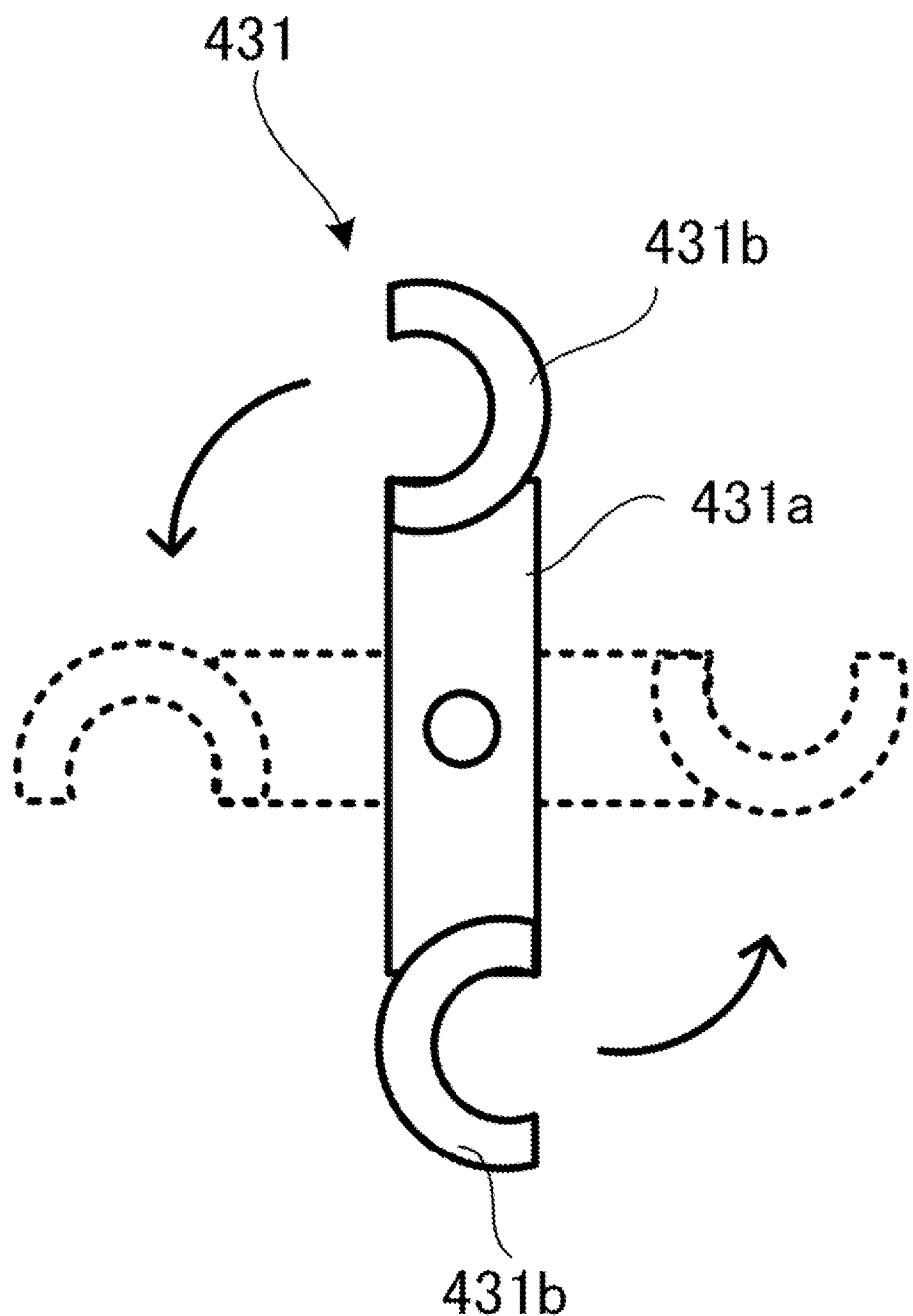
FIG. 3 is a plan view illustrating a transfer arm of an embodiment.

The transfer unit 43 includes the transfer arm 431, a shaft 432, and a driving mechanism 433. As illustrated in FIG. 3, in the transfer arm 431, the hooks 431b that supports the bottom of transport plate S while avoiding a placement base 411a of the sealing unit 41 is provided at both end of a rectangular plate 431a. The shaft 432 transfers the transport plate S supported by the hook 431b between the placement base 411a of the sealing unit 41 and the support hole 35 of the transporter 3 by rotating the transfer arm 431. The shaft 432 airtightly penetrates the bottom of the chamber 2 and is driven by the driving mechanism 433 outside the chamber 2, such as motors.

[Loading Unit]

As illustrated in FIGS. 1 and 2, the loading unit 5 loads the unprocessed workpiece W into the chamber 2 from outside via the opening 21 and loads the processes workpiece W out from the chamber 2 to the outside via the opening 21, while keeping the interior of the chamber 2 vacuum.

The loading unit 5 picks up the transport plate S on which the unprocessed workpiece W is placed from a transport mechanism TR to transport the transport plate S, such as conveyors, and loads the workpiece into the chamber 2, from the pre-processing to the post-processing. Furthermore, the loading unit 5 receives the transport plate S on which the processed workpiece W is placed in the chamber 2, and delivers the workpiece W to the transport mechanism TR.

The loading unit 5 includes an arm 51 and a holder 52. The arm 51 is a long cuboid-shape component in parallel with the plane of the transporter 3 between the transport mechanism TR and the chamber 2. The arm 51 is provided at each 180 degrees with an axis in parallel with the rotation axis of the transporter 3 as a center, and is intermittently rotatable by the motor that is the driving source.

The holder 52 is provided at both end of the arm 51 and is a circular tabular component to hold the transport plate S. The holder 52 includes a holding mechanism 52a, such as a mechanical chuck and holds the workpiece W by the holding mechanism 52a. The holding mechanism 52a may be a vacuum chuck or an electrostatic chuck. The holder 52 is configured to reciprocate in the direction in parallel with the rotation axis of the arm 51 by a cylinder that is the driving source. The holder 52 also acts as a lid to open and close the opening 21. That is, the outer diameter of the holder 52 is larger than that of the opening 22, a sealing component such as O-ring is provided to the holder 52, and the opening 21 can be sealed by pressing the holder 52 via the sealing component.

[Load-Lock Room]

The load-lock room 6 is configured by space surrounded by the holder 52 and the sealing 411 that seal the opening 21. A ventilation path 2b is provided to exhaust and release to atmosphere of the load-lock room 6 at the chamber 2. The ventilation path 2b acts as an exhausting port to exhaust the load-lock room 6 and a ventilation port to break vacuum of the load-lock room 6. The ventilation port is connected to an unillustrated air-pressure circuit including a depressurizing pump and a valve to switch the exhausting and vacuum breaking inside the load-lock room 6.

[Pre-Processing Unit]

The pre-processing unit 7 performs plasma processing on the workpiece W by producing plasma inside processing space P into which processing gas G is introduced. The plasma processing of the present embodiment is a bombardment process to improve the adhesion of the formed film. As illustrated in FIG. 2, the pre-processing unit 7 includes a container 71 and a plasma generator to produce plasma inside the container 71. The plasma generator is configured by a cylindrical electrode 72, a RF power supply 74, a matching box 75, and an introducing unit 76.

The container 71 is a component that surrounds the processing space P and has an opening at the bottom. The container 71 is embedded in the ceiling corresponding to the opening 22 of the chamber 2 so that the bottom of the container 71 faces toward the transporter 3 inside the chamber 2. That is, the pre-processing unit 7 is provided at the ceiling-side in the chamber 2. Note that a ventilation path 77 for exhausting in the processing space P is provided to an upper portion of the opening 22 in the chamber 2. The ventilation path 77 is connected to the to an unillustrated air-pressure circuit including a depressurizing pump and a valve via the piping 77a to enable exhausting in the processing space P.

The cylindrical electrode 72 is in a square-cube shape and has an opening 72a at one, and the other end is blocked. The cylindrical electrode 72 is provided in the direction the opening 72a faces toward the chamber 2. A flange 72b extending outward is provided at the end of the cylindrical electrode 72 opposite the opening 72a. An outer edge of the flange 72b is airtightly fixed to an inner edge of the container 71. The opening 22 of the chamber 2 facing the opening 72a is provided at the inner side of the protrusion 22a protruding annularly. The inner side of the opening 22 configures a part of the processing room P to perform plasma processing.

To plasma process the workpiece W, the transport plate S is set to cover the opening 22 without contacting the opening 22 even when the transport plate S gets close to the opening 22 of the chamber 2 by the biasing unit 42. That is, the flange S1 of the transport plate S gets close to the position that can suppress the gas leakage from the processing space P by covering the opening 22, and is positioned at where the transport plate S does not contact the protrusion 22a. For example, a distance d between the flange S1 and protrusion 22a is preferably 1 to 5 mm. Furthermore, a curved path is formed between the transport plate S covering the opening 22 and the opening 22. That is, a gap between the protrusion 22a and the flange S1 is a curved path.

The RF power supply 74 to apply high frequency current is connected to the cylindrical electrode 72. The matching box 75 that is a matching circuit is connected to an output side of the RF power supply 74. The matching box 75 stabilize the discharge of plasma by matching the impedances of the input-side and the output-side.

The introducing unit 76 introduces the processing gas G into the processing space P. The introducing unit 76 includes a piping 76a connected to an unillustrated supply source of the processing gas G, such as bombes. The piping 76a is connected to the supply source of the processing gas G, airtightly seals the container 71, and penetrates the cylindrical electrode so that the end of the piping 76a reaches the processing space P. Noble gas may be used as the processing gas G, and for example, argon gas is preferable.

In the pre-processing unit 7, high frequency current is applied from the RF power supply 74 to the cylindrical electrode 72. By this, the processing gas G in the processing space P becomes plasma, and the surface of the workpiece W facing the processing space P is processed by generated radicals and ions, for example.

[Film Formation Unit]

The film formation unit 8 includes a sputtering source configured by a target 81 and a backing plate 82, etc., and the plasma generator configured by an unillustrated power supply and an introducing unit. The plasma generator produces plasma, the target 81 formed of film formation material is exposed to said plasma. By this, the film formation unit 8 bombards ions included in the plasma to the film formation material and deposits the beaten-out particles on the workpiece W to form film on the workpiece W. The film formation unit 8 of the present embodiment performs film formation by sputtering in the workpiece W passing through the position facing the target 81.

The target 81 is a tabular component formed of the film formation material that would be deposited on the workpiece to form film. The target 81 is provided on the transport path of the transport plate S placed on the transporter 3 away from the transport plate S. A surface of the target 81 is held on the ceiling corresponding to the opening 23 of the chamber so as to face the workpiece W placed on the transporter 3. The backing plate 82 is a supporting component to support the target 81. Furthermore, magnets, cooling mechanisms, etc., may be appropriately equipped to the sputtering source, if necessary.

The power supply is a DC power supply or a RF power supply that apply high current to the target 81 from outside the chamber 2. The introducing unit introduces the sputtering gas into the chamber 2. The introducing unit includes a supply source of the sputtering gas, such as bombes, a piping, and a gas introducing hole, and introduces the sputtering gas for film formation into the space formed between the transporter 3 and the target 81. Noble gas may be used as the sputtering gas, and for example, argon gas is preferable.

In the film formation unit 8, the sputtering gas is introduced from the introducing unit, and the power supply applies high current to the target 81. Then, the sputtering gas in the space formed between the transporter 3 and the target 81 becomes plasma, and active species of ions, etc., are produced. The ions in the plasma bombard the target 81 and beats out the particles of the film formation material.

The workpiece W that is being circulated and transported by the transporter 3 passes through this space. The particles of film formation material beaten out are deposited on the workpiece W when the workpiece W passes though said space, and the film of the particles are formed on the workpiece W. The workpiece W is circulated and transported by the transporter 3 and repeatedly passes though said space so that the film formation proceeds.

As illustrated in FIG. 1, five film formation units 8 are provide in the circumferential direction. Dividers 28 are provided between each film formation unit 8 and between the pre-processing unit 7 and the film formation unit 8. The divider 28 divides the space where the film formation by the film formation unit 8 is performed. That is, the space where the processing by the film formation unit 8 is divided by the divider 28, so that the diffusion of the film formation material and the gas can be suppressed. A gap between which the workpiece W and the transport plate S on the rotating transporter 3 pass through is formed between a lower end of the divider and the transporter 3. That is, the height of the divider 28 is set so that there would be slight gap between a lower edge of the divider 28, and the workpiece W and the transport plate S. Note that the material of the target 81 of each film formation material, that is, the film formation material may be the same or different.

Note that the processing space of the film formation unit 8 surrounded by the divider 28 is further surrounded by a box-type shielding component 83 which has a hole opened for the target 81. The box-type shielding component 83 suppresses the film formation material and the sputtering gas from diffusing in the chamber 2 also in the radial direction in addition to diffusing in the circumferential direction of the transporter 3. The box-type shielding component 83 is an annular-arc shape box having an annular-arc (annular sector) plate arranged in parallel with the plane of the transporter that is the rotation table as a ceiling. The box-type shielding component 83 is defined by an outer wall extending from an outer arc of the annular-arc ceiling, an inner wall extending from an inner arc of the annular-arc ceiling, and a side wall extending from a side along the radius of the annular-arc ceiling, and has a surface facing toward the transporter 3 that is opposite the ceiling opened. A gap through which the workpiece W on the transporter 3 can pass is formed between a lower end of the box-type shielding component 83 and the transporter.

[Controller]

The controller 80 is a device to control each component of the film formation apparatus 1. For example, the controller 80 may be configured by a computer, etc., that operate by dedicated electronic circuits or predetermined programs. The control contents of the controller 80 are programmed, and are executed by processing devices such as PLC (Programmable Logic Controller) and CPU (Central Protocol Unit).

For example, the controller 80 controls the exhausting in the chamber 2, the loading in and out of the transport plate S by the loading unit 5, the exhausting and releasing to atmosphere of the load-lock room 6, the pre-processing by the pre-processing unit 7, the rotation by the transporter 3, the movement of the transport plate S by the driving unit 4, and the film formation by the film formation unit 8.

[Operation]

The process to form film on the workpiece W by the film formation apparatus 1 according to the present embodiment as described above will be described in detail with the reference to figures. Note that, in the present embodiment, the pre-processing is performed on the workpiece W placed on the transport plate S by the loading unit 5 each time the workpiece W is loaded into the chamber 2. That is, the transport plate S on which the unprocessed workpiece W is placed is placed on the support hole 35 of the transporter 3, and the transporter 3 is rotated so that the vacant support hole 35 which are not supporting the transport plate S comes below the opening 22. Then, the transport plate S on which the next workpiece W is placed is loaded into the chamber 2 to perform the pre-processing. By repeating this, the transport plate S on which the pre-processed workpiece W is placed is placed on the support hole 35 of the transporter 3. When all the support holes 35 supports the transport plates S, the film formation process is performed by the film formation unit 8 while rotating the transporter 3.

(Loading Operation)

Firstly, an operation to load the workpiece W to which the film formation is to be performed by the loading unit 5 will be described. As illustrated in FIG. 2, the sealing 411 of the sealing unit 41 is sealing the opening 21, and the interior of the chamber 2 is made vacuum by the exhausting process of the air pressure circuit. Meanwhile, the holder 52 of the loading unit 5 descends toward the transport mechanism TR, and the holding mechanism 52a holds the transport plate S on which the unprocessed workpiece W is placed. When the holder 52 ascends, the transport plate S is picked up from the transport mechanism TR.

Figure 4A:
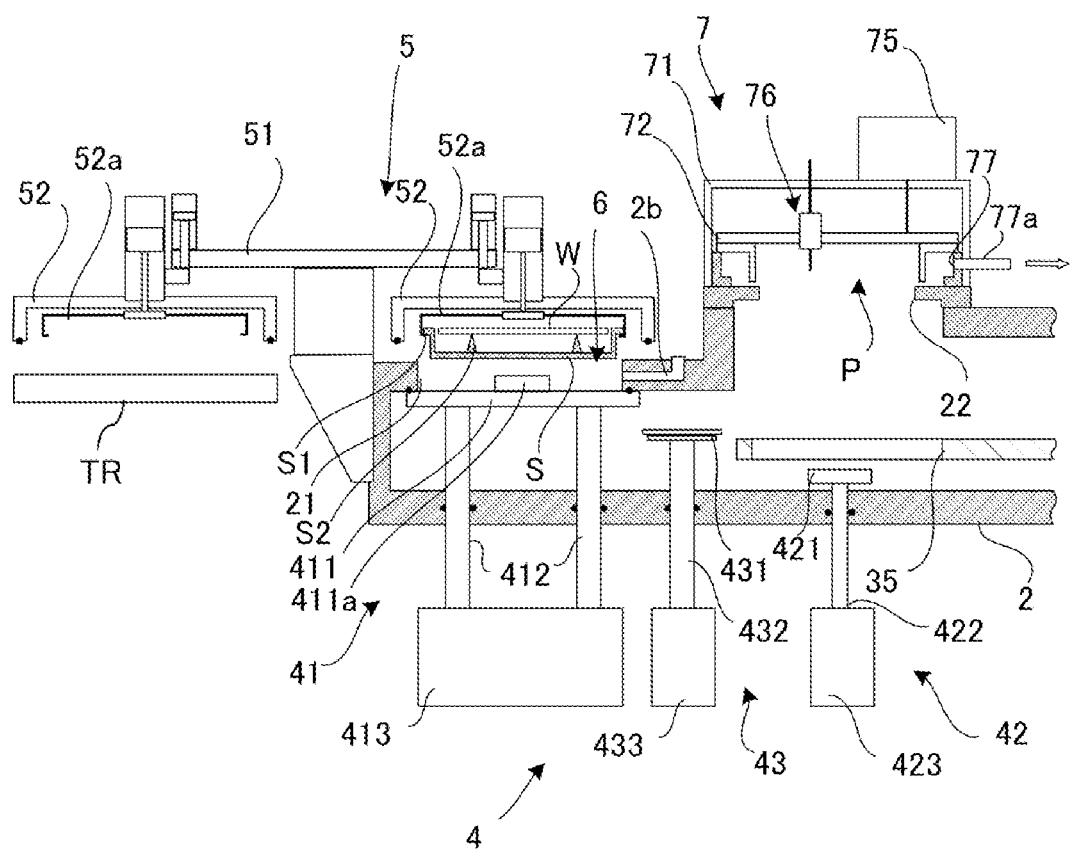
FIG. 4(A) is a cross-sectional diagram illustrating a state in which a transport plate is positioned into a load-lock room along A-A line.

Then, as illustrated in FIG. 4(A), the arm 51 rotates, and the transport plate S on which the unprocessed workpiece W is placed is positioned at the position facing the opening 21.

Figure 4B:
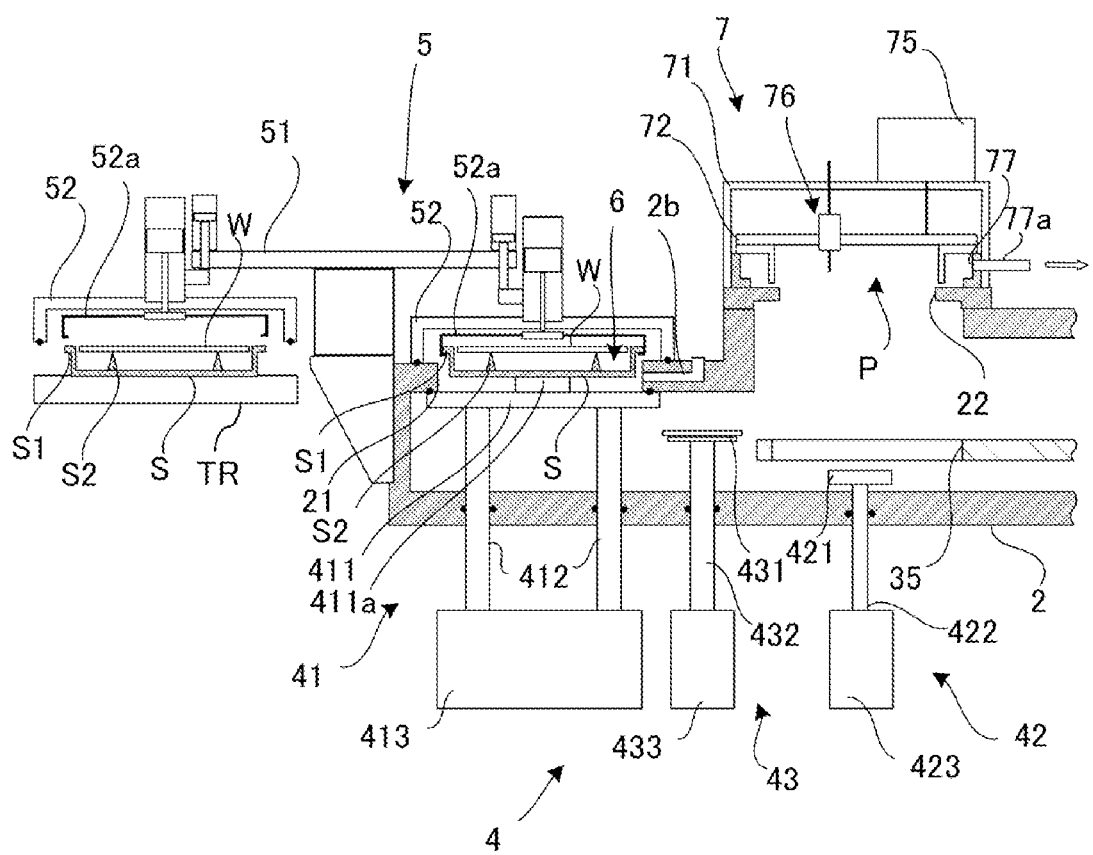
FIG. 4(B) is a cross-sectional diagram illustrating a state in which the load-lock room is sealed along A-A line.

As illustrated in FIG. 4(B), when the holder 52 descends, the transport plate S is placed on the placement base 411a of the sealing 411 while sealing the opening 21. By this, the load-lock room 6 is sealed by the sealing 411 and the holder 52.

Figure 5A:
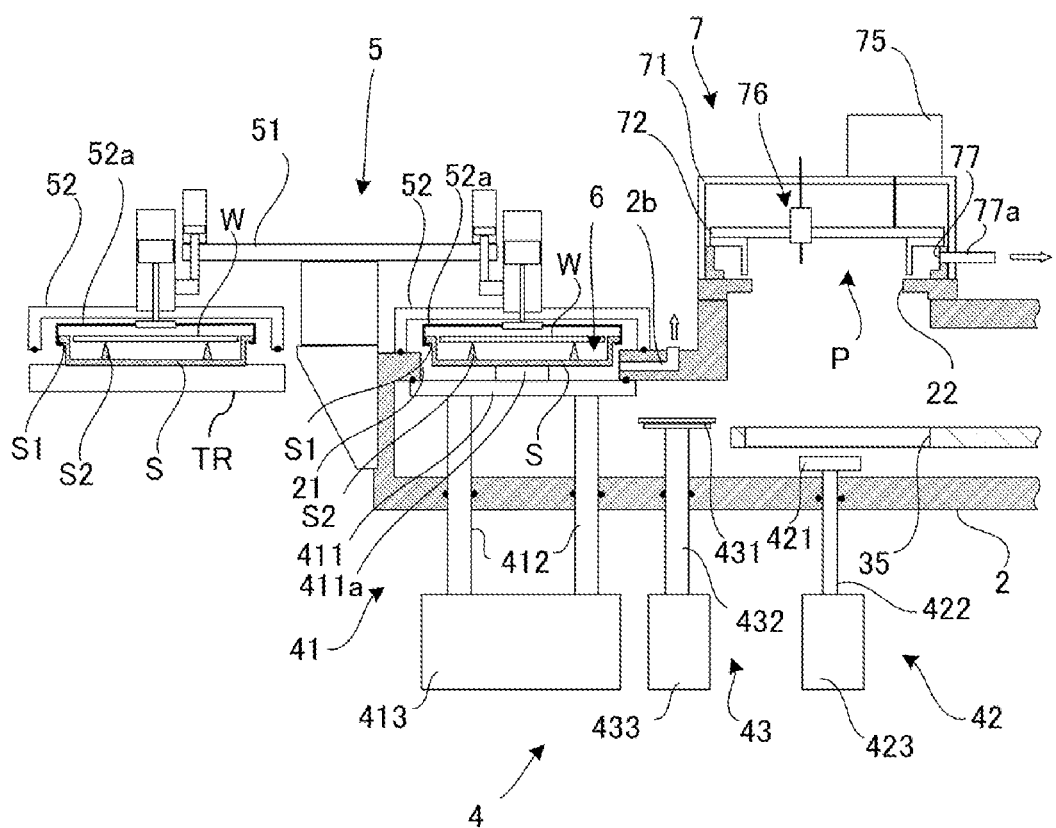
FIG. 5(A) is a cross-sectional diagram illustrating a state in which the load-lock room is exhausted along A-A line.
Figure 5B:
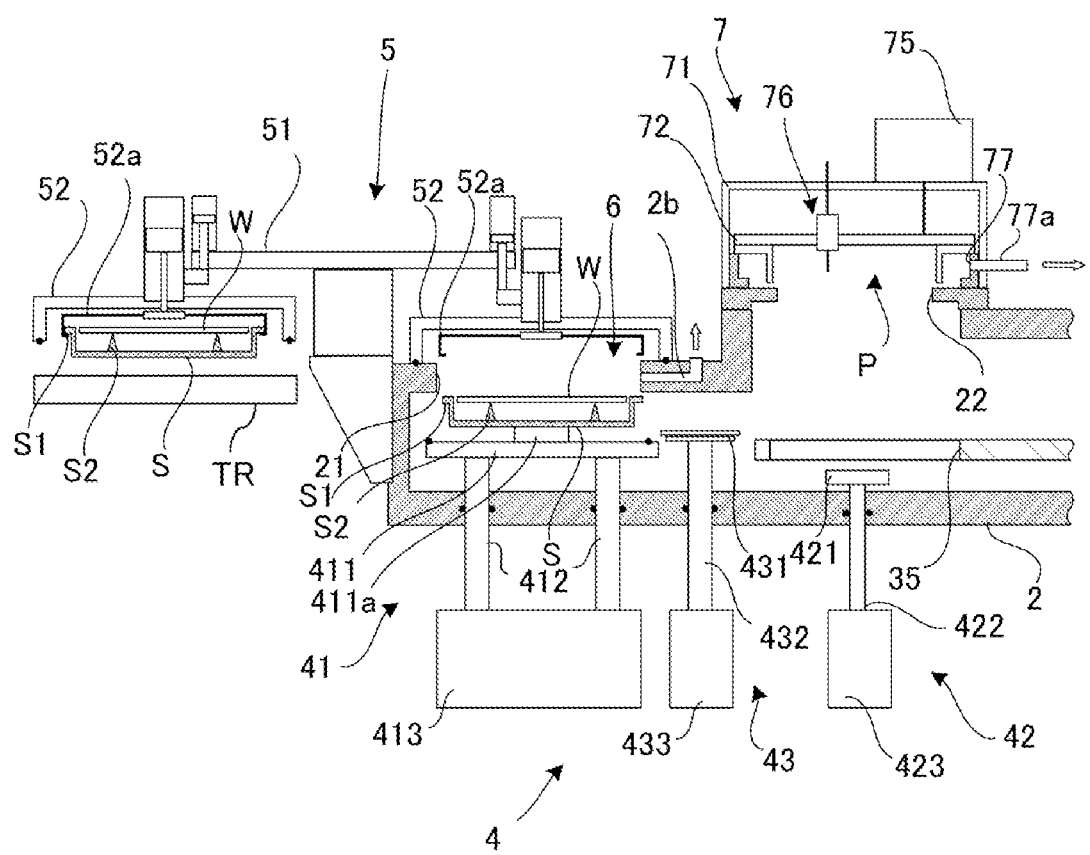
FIG. 5(B) is a cross-sectional diagram illustrating a state in which the transport plate is transported into the load-lock room along A-A line.

Then, as illustrated in FIG. 5(A), the load-lock room 6 is exhausted from the ventilation path 2b by the air pressure circuit and becomes vacuum. Note that the other holder 52 of the loading unit 5 descends toward the transport mechanism TR, and the holding mechanism 52a holds the transport plate S on which the unprocessed workpiece W is placed. Next, as illustrated in FIG. 5(B), the sealing 411 moves in the direction distant from the opening 21 together with the transport plate S. At this time, since the opening 21 is sealed by the holder 52, the interior of the chamber is kept vacuum. Note that the other holder 52 holds the transport plate S on which the unprocessed workpiece W is placed and ascends, and the transport plate S is picked up by the transport mechanism TR.

Figure 6A:
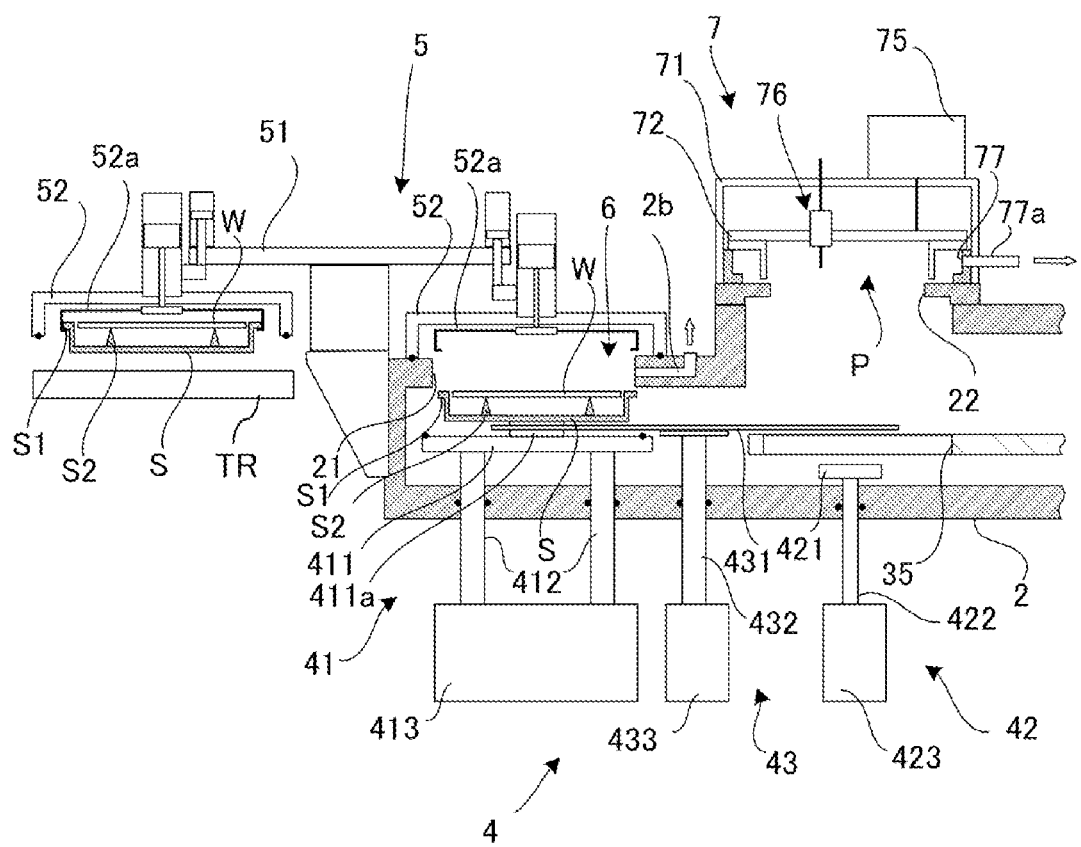
FIG. 6(A) is a cross-sectional diagram illustrating a state in which the transfer arm is positioned at a lower portion of the transport plate along A-A line.
Figure 6B:
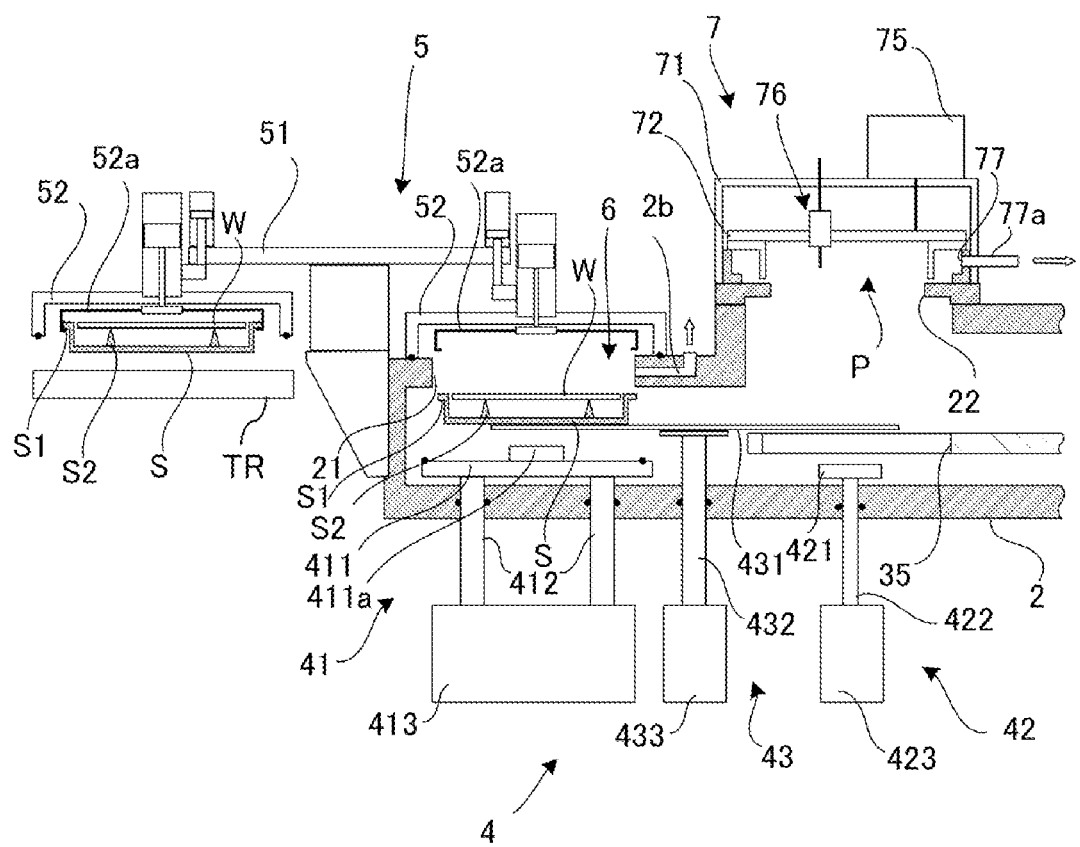
FIG. 6(B) is a cross-sectional diagram illustrating a state in which the transport plate is supported by the transfer arm.

Then, as illustrated in FIG. 6(A), the transfer arm 431 of the transfer unit 43 rotates, and the hook 431b of the transfer arm 431 is inserted in the lower portion of the transport plate S. At this state, as illustrated in FIG. 6(B), when the sealing 411 of the sealing unit 41 descends, since the placement base 411a gets away from the lower portion of the transport plate S, the transport plate S is supported by the hook 431b.

Figure 7A:
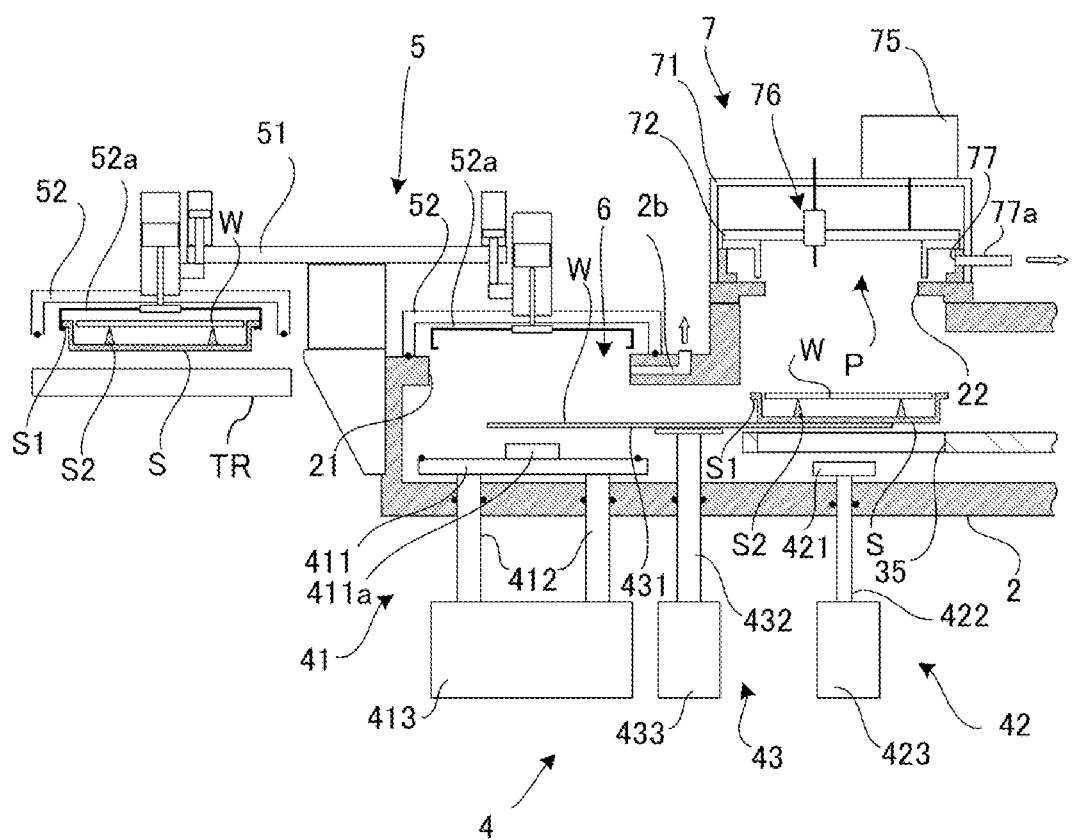
FIG. 7(A) is a cross-sectional diagram illustrating a state in which the transport plate is positioned in the pre-processing unit along A-A line.
Figure 7B:
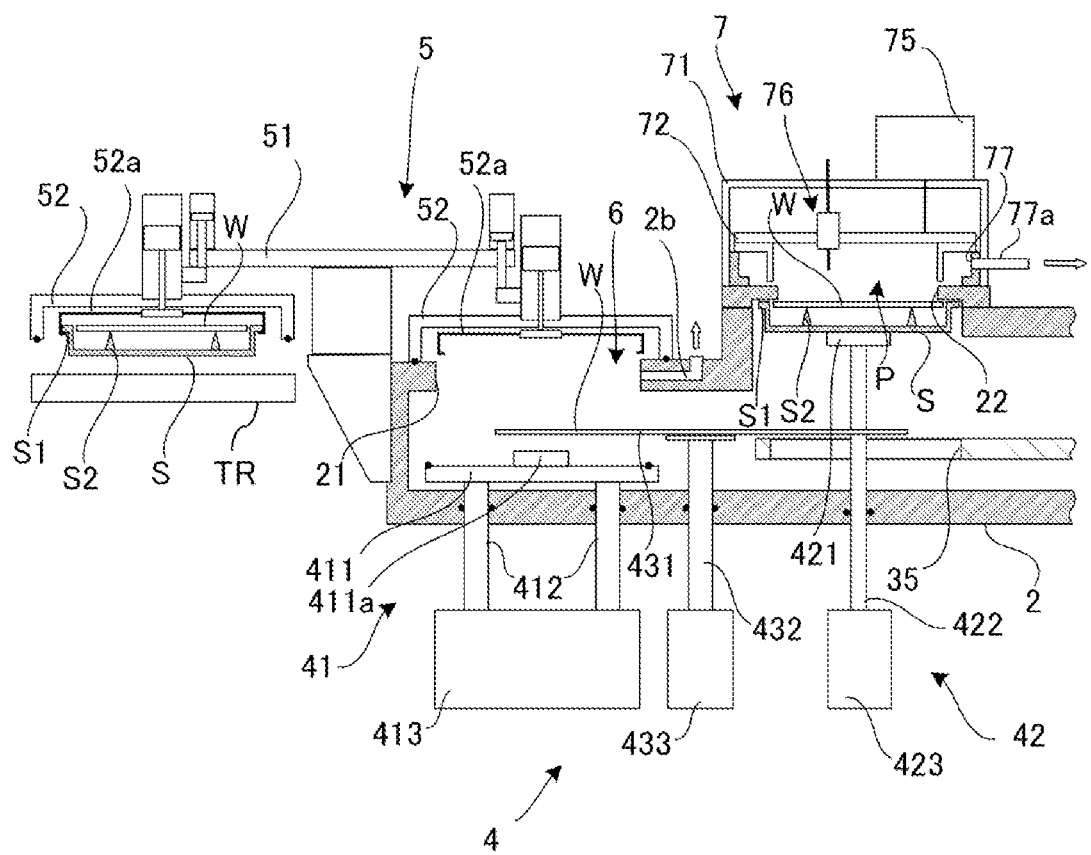
FIG. 7(B) is a cross-sectional diagram illustrating a state in which the transport plate is covering an opening along A-A line.

Next, as illustrated in FIG. 7(A), the transfer arm 431 of the transfer unit 43 rotates, and the transport plate S comes above the support hole 35 of the transporter 3. At this state, as illustrated in FIG. 7(B), when the pusher 421 of the biasing unit 42 ascends, the transport plate S ascends to the position covering the opening 21 and is stopped.

Figure 8A:
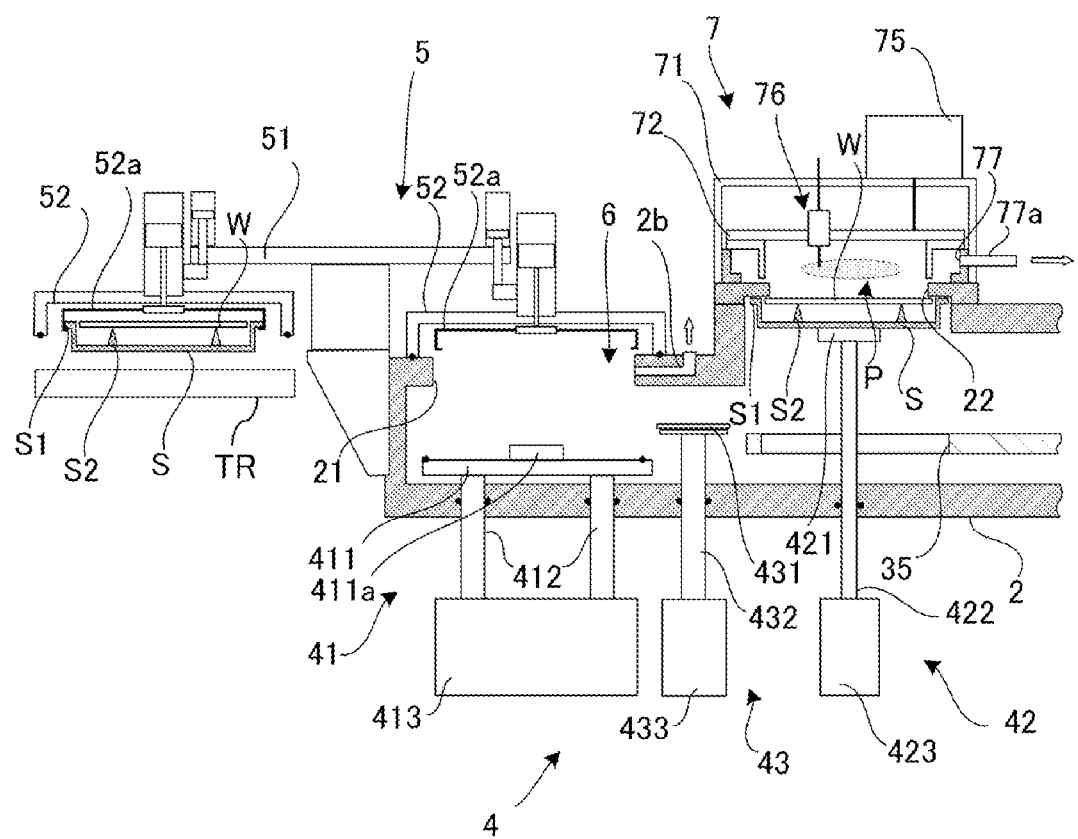
FIG. 8(A) is a cross-sectional diagram illustrating a state in which the workpiece is pre-processed in the pre-processing unit along A-A line.
Figure 8B:
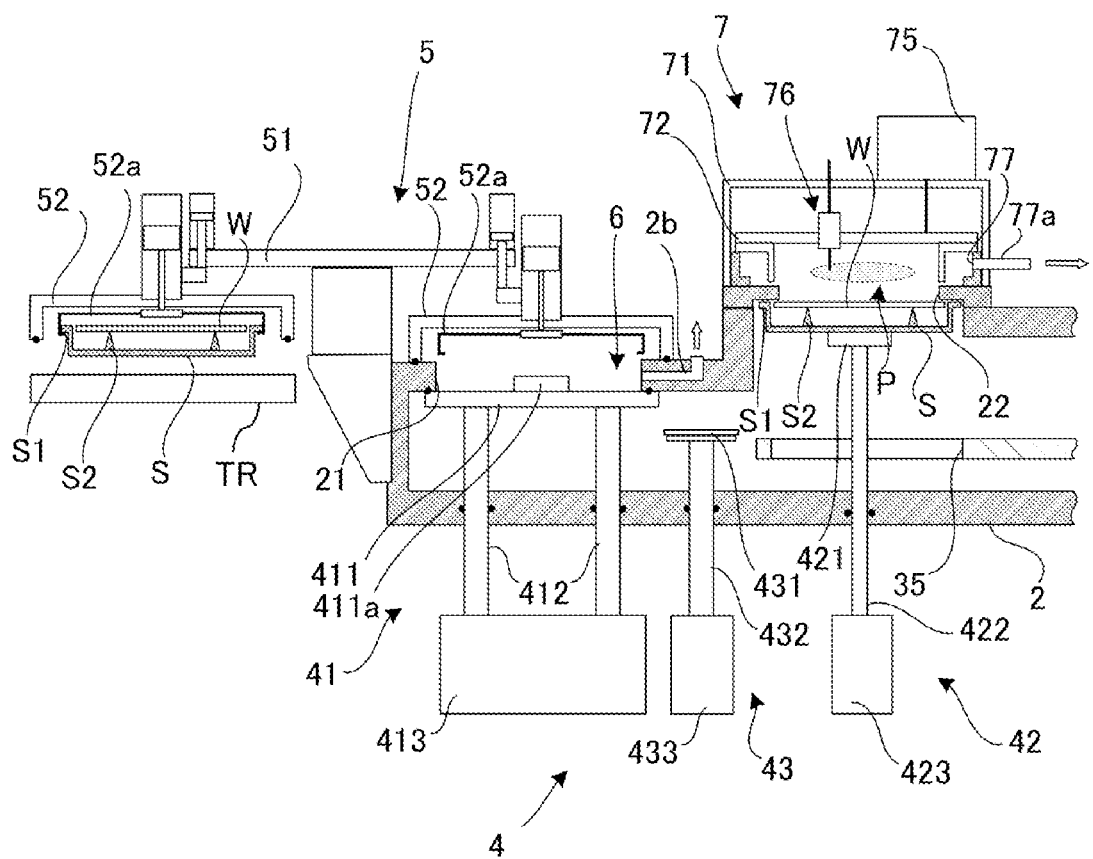
FIG. 8(B) is a cross-sectional diagram illustrating a state in which in which the load-lock room is sealed along A-A line.

As illustrated in FIG. 8(A), the processing gas G is introduced into the processing space P from the introducing unit 76, current is applied to the cylindrical electrode 72, and the plasma processing is performed on the workpiece W placed on the transport plate S by radicals and ions, etc., produced by the plasma produced by the application of said current. During this plasma processing, as illustrated in FIG. 8(B), the sealing 411 ascends and the opening 21 is sealed. By this, the load-lock room 6 is sealed to become vacuum.

Figure 9A:
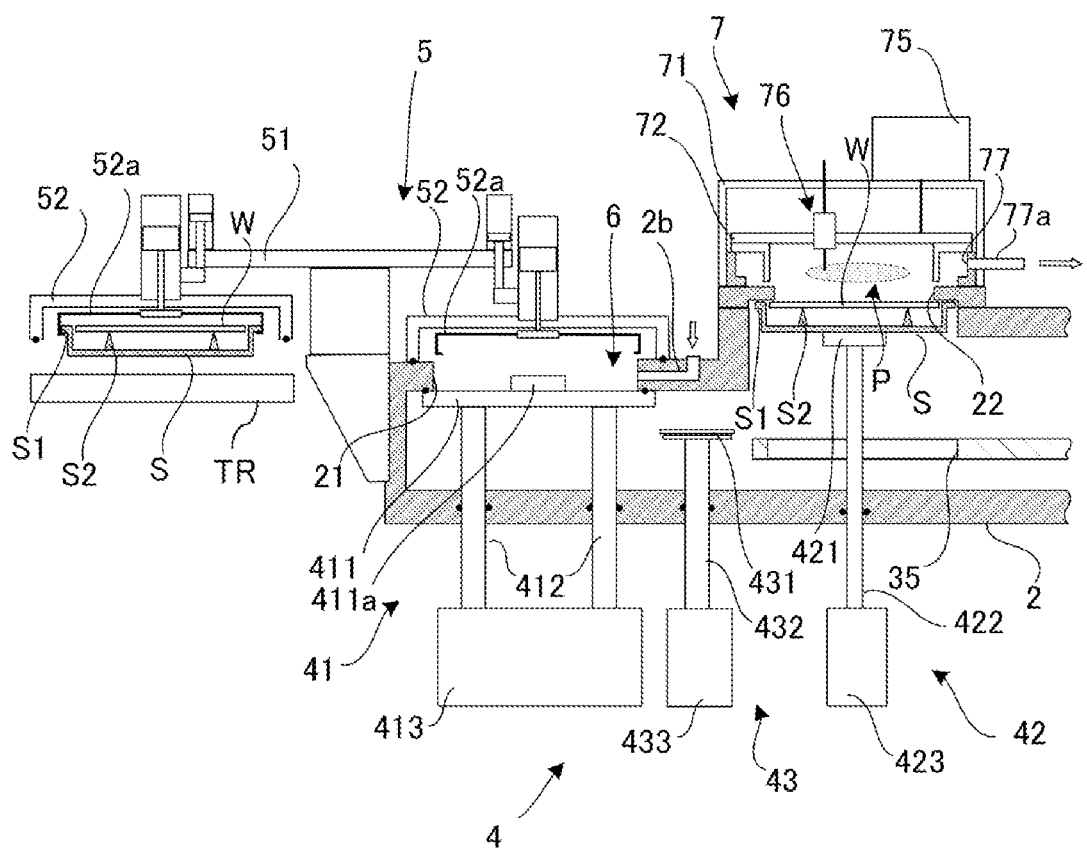
FIG. 9(A) is a cross-sectional diagram illustrating a state in which vacuum of the load-lock room is broken along A-A line.
Figure 9B:
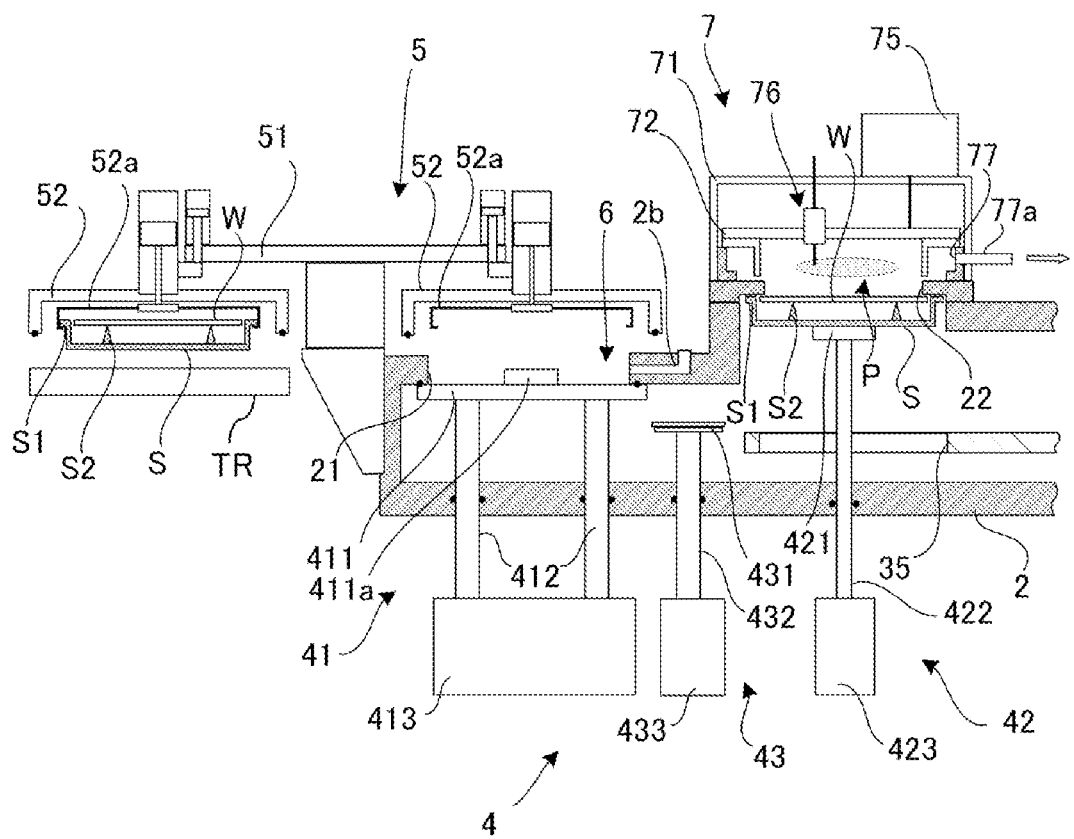
FIG. 9(B) is a cross-sectional diagram illustrating a state in which the load-lock room is released along A-A line.

Then, as illustrated in FIG. 9(A), by supplying vent gas via the ventilation path 2b, the vacuum inside the load-lock room 6 is broken. Furthermore, as illustrated in FIG. 9(B), the holder 52 moves in the direction away from the opening 21, and the load-lock room 6 is released to atmosphere.

Figure 10A:
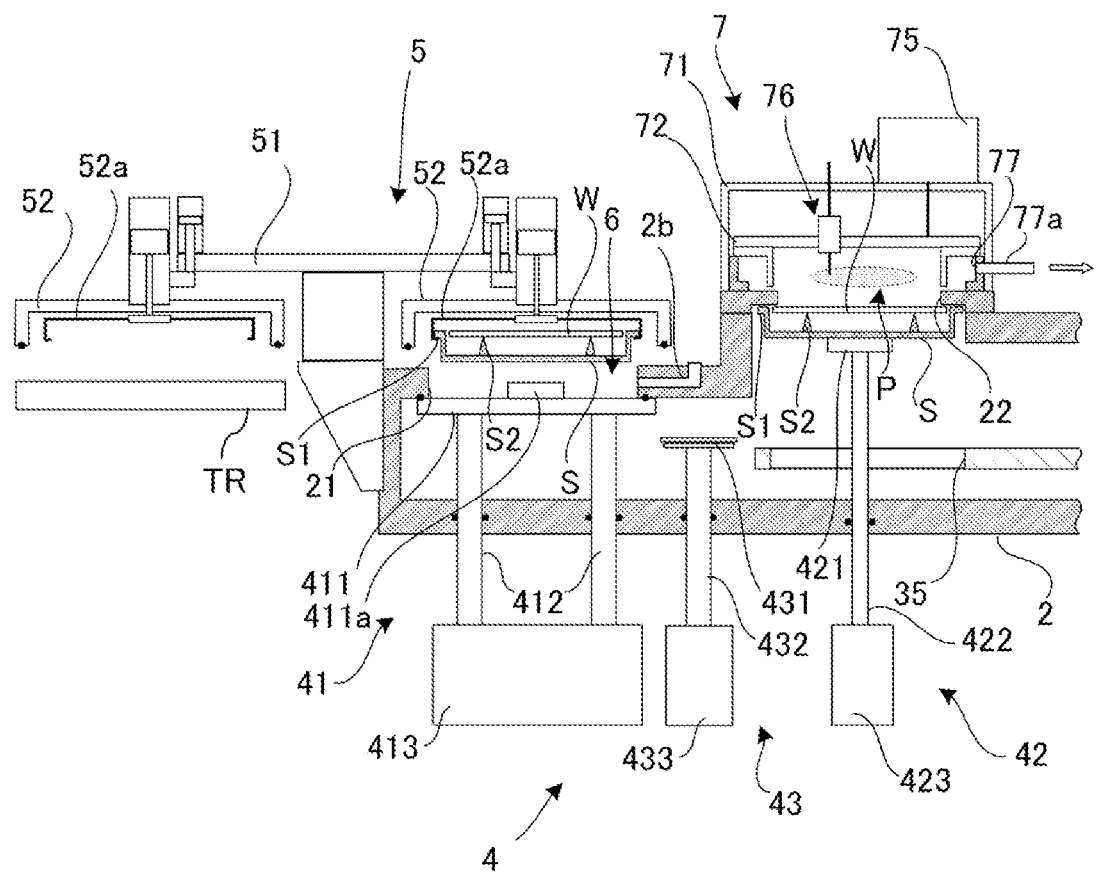
FIG. 10(A) is a cross-sectional diagram illustrating a state in which the next transport plate is positioned in the load-lock room along A-A line.
Figure 10B:
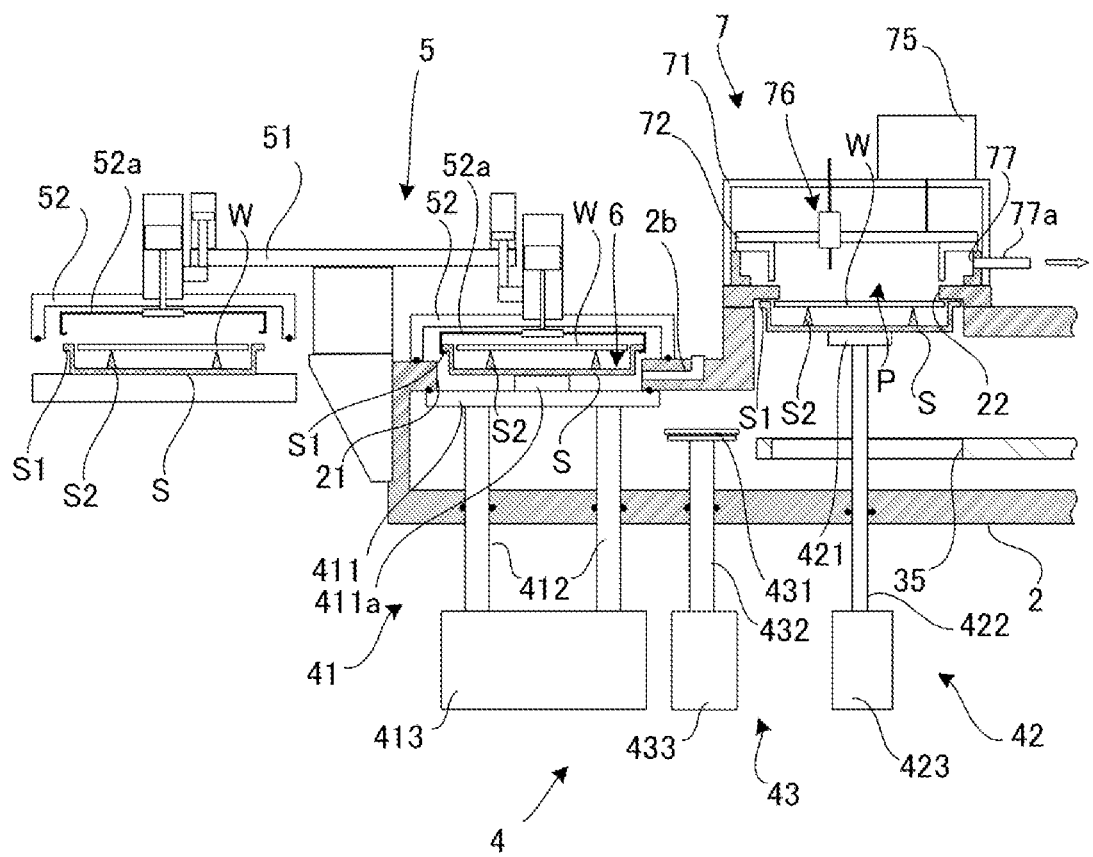
FIG. 10(B) is a cross-sectional diagram illustrating a state in which the load-lock room is exhausted along A-A line.

As illustrated in FIG. 10(A), the arm 51 rotates, and the holder 52 holding the transport plate S on which the unprocessed workpiece W is placed comes to the position facing the opening 21. Then, as illustrated in FIG. 10(B), the holder 52 descends, and the transport plate S is placed on the placement base 411a of the sealing 411 while sealing the opening 21. By this, the load-lock room 6 is sealed by the sealing 411 and the holder 52. Note that the introduction of the processing gas G in the pre-processing unit 7 and the application of the current to the cylindrical electrode 72 is stopped to finish the plasma processing.

Figure 11:
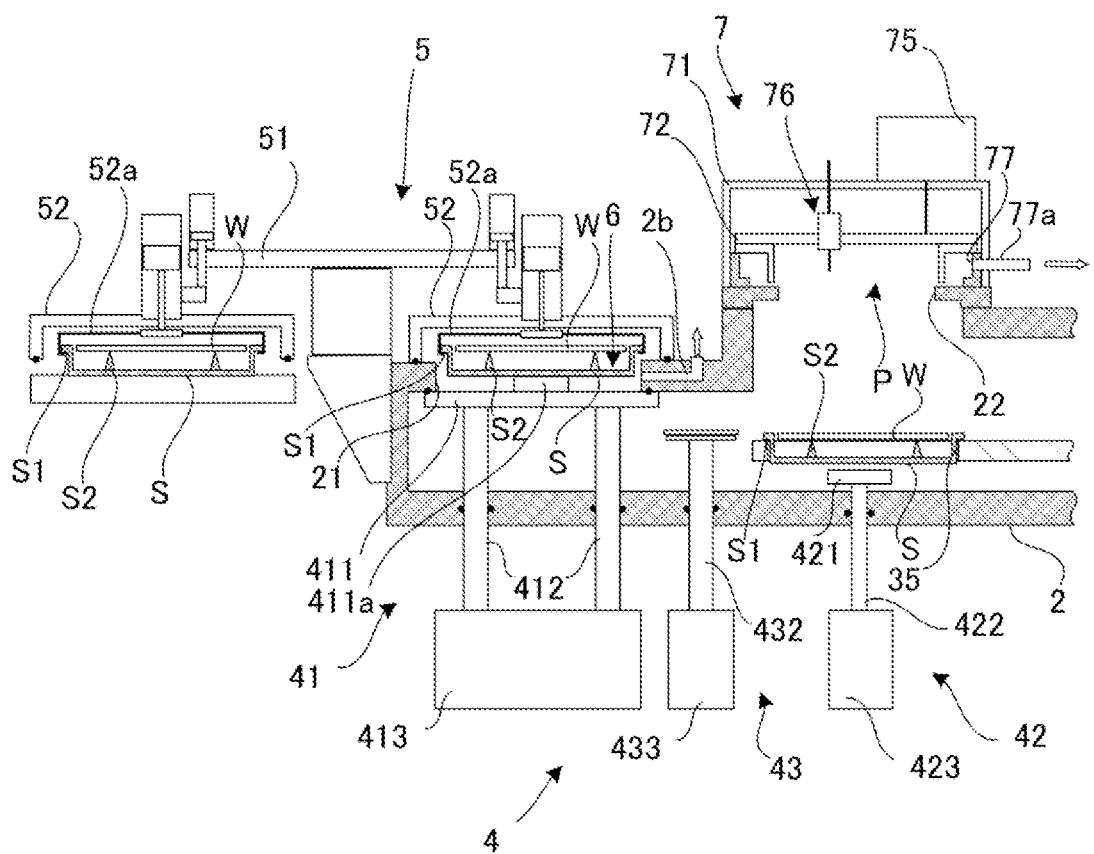
FIG. 11 is a cross-sectional diagram illustrating a state in which the transport plate which has been pre-processed is placed on the transporter along A-A line.

As illustrated in FIG. 11, the pusher 421 of the biasing unit 42 descends, and the transport plate S which has finished the plasma processing is descended and is placed on the support hole 35 of the transporter 3. Then, the transporter 3 is rotated, and the vacant support hole 35 which are not supporting the transport plate S is positioned below the pre-processing unit 7. Afterward, the operations of FIGS. 5 to 11 are repeated, and all the support holes 35 supports the transport plates S.

Then, the transporter 3 is rotated, the transport plate S placed on the transporter 3 is circulated and transported in the trajectory of circle, and the film formation process is performed on the workpiece W on the transport plate S by the film formation unit 8.

[Effect]

(1) The film formation apparatus 1 of the present embodiment includes: the chamber 2 that can be made vacuum; the transporter 3 that is provided inside the chamber 2 and that circulates and transports the workpiece W in the trajectory of circle; the film formation unit 8 that forms film by sputtering on the workpiece W circulated and transported by the transporter 3; the load-lock room 6 that loads the workpiece W into and out of the chamber 2 relative to air space while keeping the interior of the chamber 2 vacuum; and the pre-processing unit 7 that is provided in the chamber 2 at the position adjacent to the load-lock room 6 and that performs pre-processing to the workpiece W loaded in from the load-lock room 6 in the state distant from the transporter 3.

In the present embodiment, by performing the pre-processing at the position adjacent the load-lock room 6 and distant from the transporter 3 used at the time of film formation, the effect to the film formation process by gas from the pre-processing unit 7, etc., the stable film formation can be achieved.

Furthermore, although the loading-in position from the load-lock room 6 in the chamber 2 was only used for loading-in so far, by arranging the pre-processing unit 7 here, the space that had been used by the pre-processing unit 7 may be effectively used for the film formation unit 8, for example. By this, the number of the film formation unit 8 can be increased, and the film formation by more types of material can be performed in one chamber 2.

(2) The pre-processing unit 7 includes the biasing unit 42 that is provided at the ceiling side of the chamber 2, and that positions the workpiece W in the pre-processing unit 7 by exhausting from the transporter 3 during the film formation by the film formation unit 8 and biasing the workpiece W in the direction orthogonal to the transportation direction of the transporter 3 during the pre-processing by the pre-processing unit 7.

By this, since the workpiece W is positioned in the pre-processing unit 7 when loading each workpiece W in, single-wafer processing can be performed in the pre-processing unit 7, and the collective film formation can be performed to the plurality of the workpiece W when the loading in had been completed. Therefore, since the pre-processing can be performed by utilizing where the workpiece W is load separately, entire efficiency of the film formation process can be improved.

(3) The biasing unit 42 includes the pusher 421 that holds the workpiece W, the shaft 422 that support the pusher 421, and the driving mechanism 423 that ascends and descends the shaft 422, and the pusher 421 is provided at a position to receive the workpiece W from the load-lock room 6.

By this, the workpiece W can be received from the load-lock room 6 by moving the pusher 421 via the shaft 422 by the driving mechanism 423, and can be sequentially moved to the pre-processing unit 7. Therefore, after receiving the workpiece W from the load-lock room 6, the workpiece W can be moved to the pre-processing unit 7 only by the ascending operation without changing the horizontal position thereof, and the transportation time can be reduced.

(4) The opening 22 that is covered without contact by the transport plate S on which the workpiece W is placed is provided between the chamber 2 and the pre-processing unit 7. Therefore, the gas is suppressed from flowing into the chamber 2 from the pre-processing unit 7 by the transport plate S, and the effect to the film formation can be reduced. Furthermore, since the opening 22 is covered without contact, dust produced by sliding when the opening is sealed by contact would not diffuse, and the effect to the film formation is suppressed.

(5) The curved path is formed between the pre-processing unit 7 and the chamber 2 by covering the opening 22 by the transport plate S. Therefore, the gas hardly flows into the chamber 2, and the effect to the film formation is further suppressed.

(6) The pre-processing unit 7 includes the processing space P to which the processing gas G is introduced, and the plasma generator that performs plasma processing on the surface of the workpiece W by producing plasma in the processing space P to which the processing gas G was introduced. By this, the processing gas G is suppressed from flowing into the chamber 2, and the effect to the film formation is reduced.

Modified Example

The present embodiment may be modified as follows.

Figure 12:
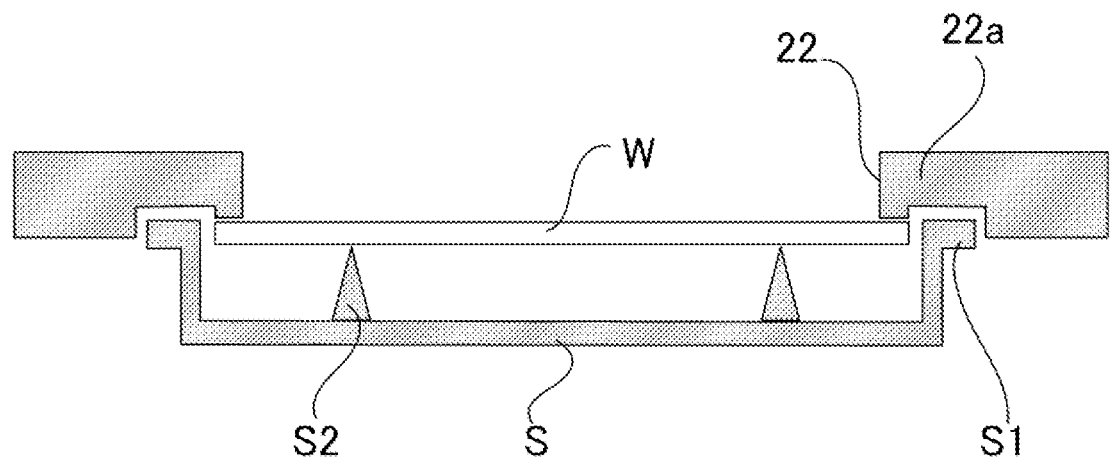
FIG. 12 is a cross-sectional diagram illustrating a modified example of the opening of the pre-processing unit along A-A line.

(1) For example, as illustrated in FIG. 12, by further protruding the protrusion 22a toward the surface of the workpiece W, by narrowing the gap between the workpiece W and the opening 21 while forming a labyrinth structure with more curved portions, gas leakage can be prevented.

Figure 13:
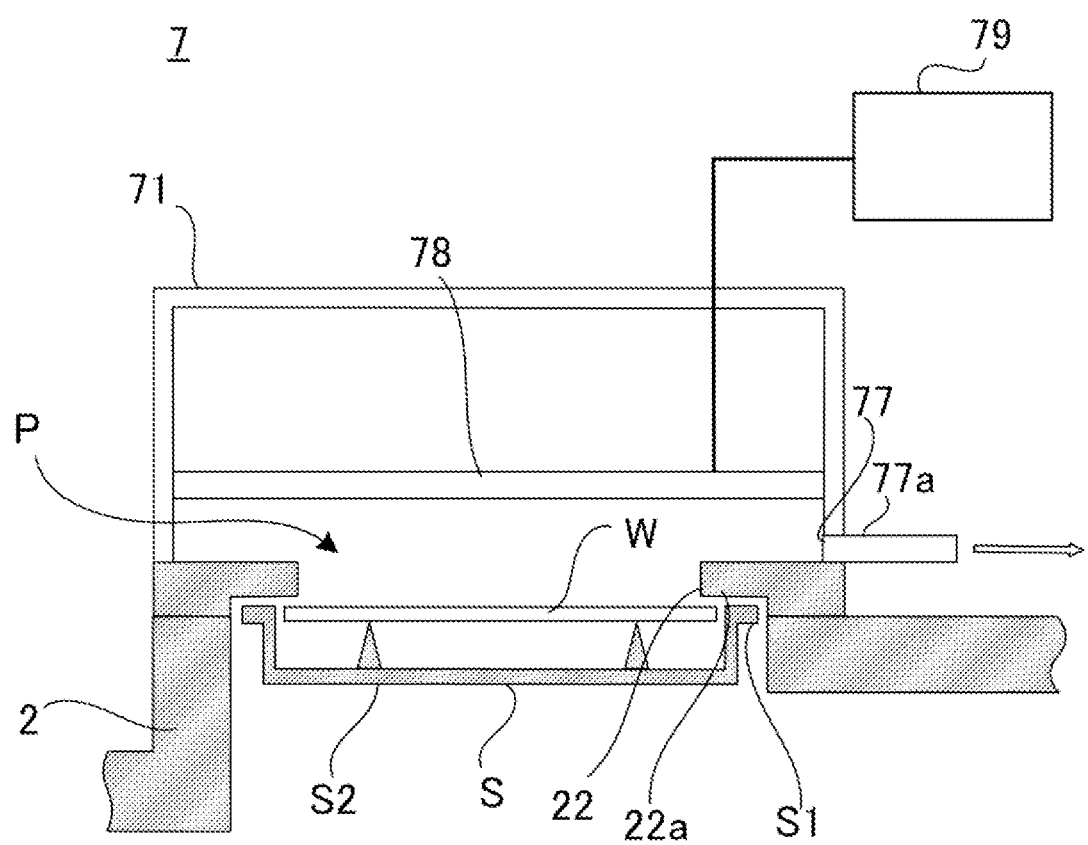
FIG. 13 is a cross-sectional diagram illustrating another aspect of the pre-processing unit.

(2) The pre-processing unit 7 may desorb the gas of the workpiece W by heating. That is, as illustrated in FIG. 13, a heater 78 that performs degassing process by heating the workpiece W may be provided in the processing space P to exhaust the gas desorbed by the heating from the ventilation path. For example, the heater 78 may be a lamp heater connected to the power supply 79. By this, even if the pre-processing is replaced with the heating, the desorbed gas is suppressed from flowing into the chamber 2.

Note that the pre-processing unit 7 may perform both the pre-processing and the heating. The plasma processing room and the heat processing room may be provided adjacent to each other, and the heat processing, and then plasma processing may be performed in this order. By this, the plasma processing and the film formation process can be excellently performed on the workpiece W which was degassed.

Other Embodiment

In above, although the embodiment of the present disclosure and modified examples thereof are described, they are only provided as examples and are not intended to limit the scope of invention. These new embodiments described above may be implemented in other various forms, and various omission, replacement, and modification may be performed without departing from the abstract of the claim. The embodiments and modifications thereof are included in the scope and abstract of the invention and invention described in scope of claims.

REFERENCE SIGN

1: film formation apparatus
2: chamber
2b: ventilation path
3: transporter
4: driving unit
5: loading unit 6: load-lock room
7: pre-processing unit
8: film formation unit
21: opening
22: opening
22a: protrusion
23: opening
24: ventilation path
25: piping
27: piping
28: divider
31: motor
34: shaft
35: support hole
S: transport plate
41: sealing unit
42: biasing unit
43: transfer unit
51: arm
52: support
52a: holding mechanism
71: container
72: cylindrical electrode
72a: opening
72b: flange
74: RF power supply
75: matching box
76: introducing unit
76a: piping
77: ventilation path
77a: piping
78: heater
79: power supply
80: controller
81: target
82: backing plate
83: box-type shielding component
411: sealing
411a: placement base
412: shaft
413: driving mechanism
421: pusher
422: shaft
423: driving mechanism
431: transfer arm
431a: plate
431b: hook
432: shaft
433: driving mechanism

What is claimed is:

1. A film formation apparatus comprising:
a chamber that can be made vacuum;
a transporter that is provided inside the chamber and that circulates and transports a workpiece in a trajectory of a circle;
a film formation unit that forms film by sputtering on the workpiece circulated and transported by the transporter;
a load-lock room that loads the workpiece into and out of the chamber relative to air space while keeping an interior of the chamber vacuum; and
a pre-processing unit that is provided in the chamber at a position adjacent to the load-lock room and that performs pre-processing to the workpiece loaded in from the load-lock room in a state distant from the transporter,
wherein an opening is provided between the chamber and the pre-processing room, the opening being covered by a transport plate on which the workpiece is placed, and the opening being covered without contact by the transport plate.

2. The film formation apparatus according to claim 1, wherein the pre-processing unit is provided at a ceiling side of the chamber, and the film formation apparatus further comprises a biasing unit that positions the workpiece in the pre-processing unit by exhausting from the transporter during the film formation by the film formation unit and biasing the workpiece in the direction orthogonal to a transportation direction of the transporter during the pre-processing by the pre-processing unit.

3. The film formation apparatus according to claim 2, wherein:
the biasing unit comprises a pusher that holds the workpiece, a shaft that supports the pusher, and a driving mechanism that ascends and descends the shaft, and
the pusher is provided at a position to receive the workpiece from the load-lock room.

4. The film formation apparatus according to claim 1, wherein a curved path is formed between the pre-processing unit and the chamber by covering the opening by the transport plate.

5. The film formation apparatus according to claim 1, wherein the pre-processing unit comprises:
a processing space to which processing gas is introduced; and
a plasma generator that performs plasma processing on a surface of the workpiece by producing plasma in the processing space to which the processing gas as introduced.

6. The film formation apparatus according to claim 1, wherein the pre-processing unit comprises:
the processing space; and
a heater that is provided in the processing space, and that performs degassing process by heating the workpiece introduced into the processing space.

7. The film formation apparatus according to claim 1, wherein the transport plate covers the opening at a position facing a protrusion that forms the opening without contacting the protrusion.

* * * * *